United States Patent [19]
Hwang

[11] Patent Number: 5,357,051
[45] Date of Patent: Oct. 18, 1994

[54] PRINTED CIRCUIT BOARD FOR REDUCING RADIO FREQUENCY INTERFERENCES

[76] Inventor: Richard H. Hwang, c/o Hung Hsing Patent Service Center, P.O. Box 55-1670, Taipei (104), Taiwan

[21] Appl. No.: 188,928

[22] Filed: Jan. 31, 1994

[51] Int. Cl.$^5$ .............................................. H05K 1/02
[52] U.S. Cl. ..................... 174/33; 174/261; 174/250
[58] Field of Search ............... 361/749; 439/77; 174/250, 254, 261, 262, 266, 268, 33, 34

[56] References Cited
U.S. PATENT DOCUMENTS

| | | | |
|---|---|---|---|
| 3,757,028 | 9/1973 | Schlessel | 174/33 |
| 4,785,135 | 11/1988 | Ecker et al. | 174/34 |
| 5,036,160 | 7/1991 | Jackson | 174/33 |
| 5,039,824 | 8/1991 | Takashima | 174/33 |

*Primary Examiner*—Leo P. Picard
*Assistant Examiner*—L. Thomas

[57] ABSTRACT

A printed circuit board includes at least a twisted pair of single-sided printed circuit board (PCB) having a twisted pair of conductive strips bonded on a same side of the PCB by mounting a plurality of jumpers on the PCB each jumper bridging between two conductor segments of one conductive strip to cross over another conductor segment of the other conductive strip, thereby forming a twisted pair of the two conductive strips on a single-sided printed circuit board for reducing radio frequency interferences.

1 Claim, 5 Drawing Sheets

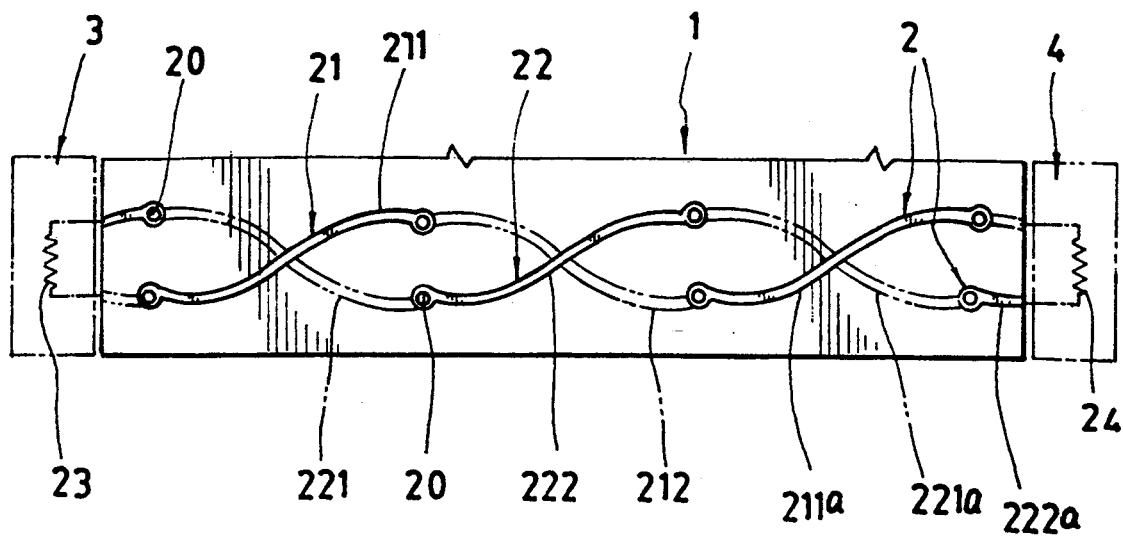
F I G. 1
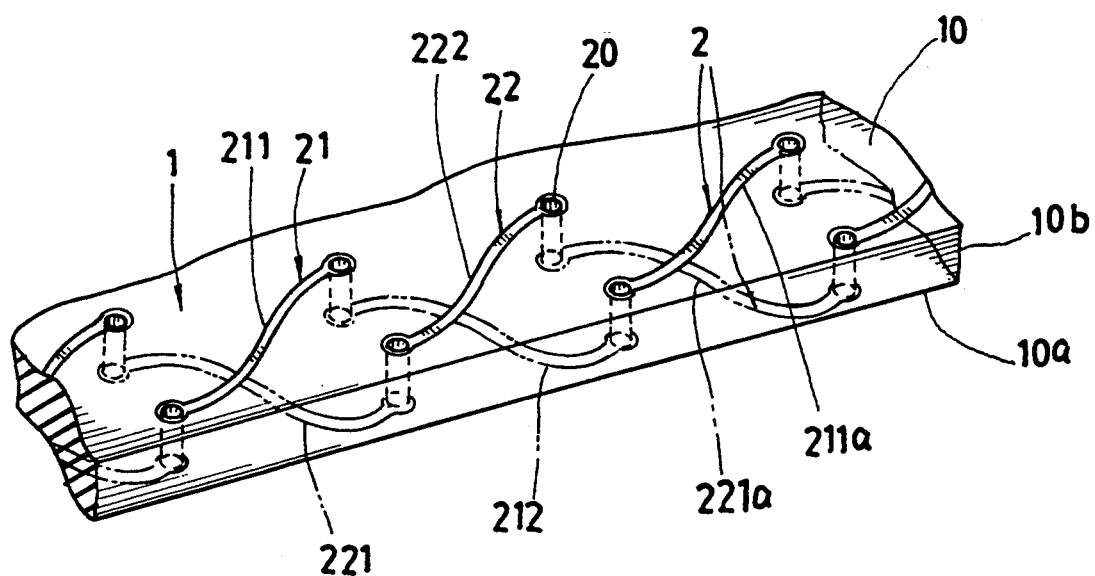
F I G. 2

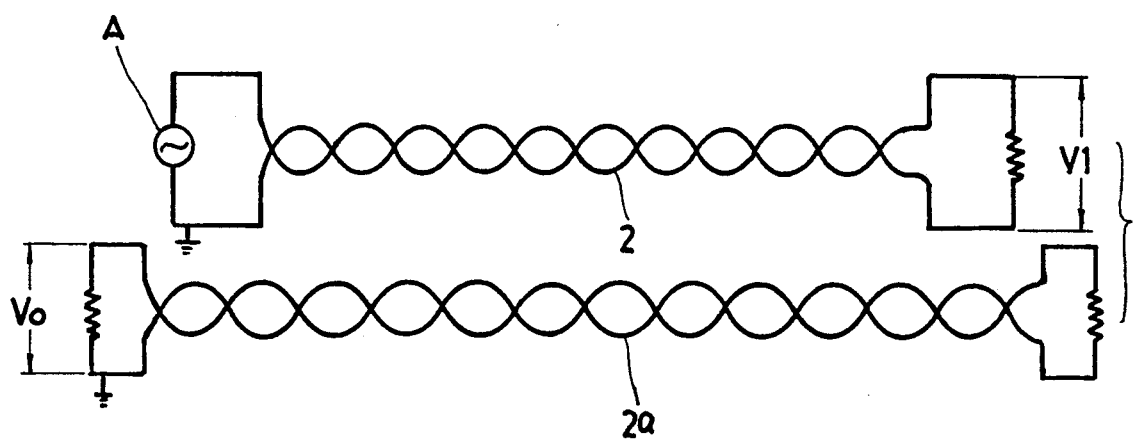
F I G. 6

PRINTED CIRCUIT BOARD FOR REDUCING RADIO FREQUENCY INTERFERENCES

BACKGROUND OF THE INVENTION

A conventional signal transmission loop consisting of two parallel cables may be used for signal communication purpose. However, the two parallel cables may not counteract the induced voltage when subjected to external magnetic field, or may not counteract the magnetic flux when passing current through the two cables, thereby unable to reduce radio frequency interferences to a communication system and thereby allowing the radio frequency interferences to damage the communication system or some electronic equipments located in the surroundings.

A twisted pair by continuously twisting two cables may be provided for a communication loop for counteracting the induced voltage when subjected to magnetic flux or for counteracting the magnetic flux when passing current through the two twisted cables of the loop in order for reducing radio frequency interefernces.

A conventional printed circuit board may also be provided with parallel signal transmission conductive strips on a single-sided printed circuit board (PCB) or a two-side PCB for signal transmission use, thereby being still unable to exclude the damage or influence caused by radio frequency interferences especially of higher frequency. Since a conventional printed circuit board is formed as a plate-like laminate sheet, not linear cables or wires, the whole PCB sheet can not be twisted to become a "twisted pair" as aforementioned for counteracting the flux or induced voltage for reducing the radio frequency interferences.

SUMMARY OF THE INVENTION

The object of the present invention is to provide a single-sided printed circuit board (PCB) having a twisted pair of conductive strips bonded on a same side of the PCB by mounting a plurality of jumpers on the PCB each jumper bridging between two conductor segments of one conductive strip to cross over another conductor segment of the other conductive strip, thereby forming a twisted pair of the two conductive strips on a single-sided printed circuit board for reducing radio frequency interferences.

BRIEF DESCRIPTION OF THE DRAWINGS

FIG. 1 is a top view illustration of a basic printed circuit board (PCB), from which the present invention is derived.

FIG. 2 is a partial perspective view of the PCB as shown in FIG. 1.

FIG. 6 is an illustration indicating a testing system for obtaining a near end crosstalk (NEXT) loss as effected by the PCB of FIGS. 1 and 2.

DETAILED DESCRIPTION

Figure 3:
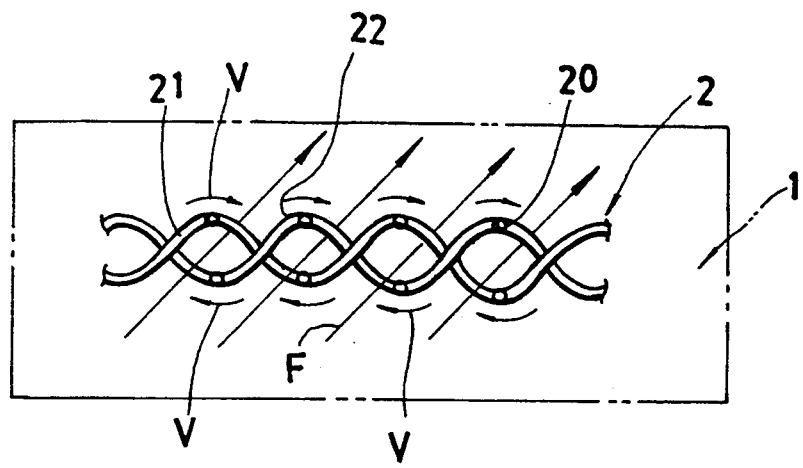
FIG. 3 is an illustration showing the operating principle of the PCB as shown in FIGS. 1 and 2 for counteracting the induced voltage on the twisted pair.

As shown in FIGS. 1 and 2, a basic printed circuit board, which is derived for forming the present invention, comprises: a two-sided printed circuit board (PCB) 1 having an upper side 10, a bottom side 10a and a laminate 10b between the upper and the bottom sides 10, 10a; at least a twisted pair 2 comprised of two conductive strips 21, 22 twisting each other on and in the printed circuit board 1 for forming a signal communication loop; a transmitter 3 operatively transmitting signal outwardly and having a transmitter loop end 23 connected with the two conductive strips 21, 22 at an input end portion of the twisted pair 2; and a receiver 4 operatively receiving the signal output from the transmitter 3 and having a receiver loop end 24 connected with the two conductive strips 21 22 at an output end portion of the twisted pair 2 opposite to the input end portion of the twisted pair 2.

The first conductive strip 21 of the twisted pair 2 includes: a primary conductor segment 211 bonded on the upper side 10 of the printed circuit board 1 and connected between two plated through holes 20 respectively formed through the laminate 10b of the printed circuit board 1, a secondary conductor segment 212 bonded on the bottom side 10a of the printed circuit board 1 and connected between the other two plated through holes 20 as continuously inflected downwardly from the primary conductor segment 211, a tertiary conductor segment 211a bonded on the upper side 10 of the printed circuit board 1 and connected between the further two plated through holes 20 in the board 1 as continuously inflected upwardly from the secondary conductor segment 212, and so on, to thereby form the first conductive strip 21 sinuously inflected on and in the printed circuit board 1 to alternatively form an upper conductor segment and a lower conductor segment subsequently and continuously bonded on the upper and the bottom sides 10, 10a of the board 1.

The second conductive strip 22 of the twisted pair 2 includes: a primary conjugated conductor segment 221 bonded on the bottom side 10a of the printed circuit board 1 and connected between two plated through holes 20 respectively formed through the laminate 10b of the printed circuit board 1, a secondary conjugated conductor segment 222 bonded on the upper side 10 of the printed circuit board 1 and connected between the other two plated through holes 20 as continuously inflected upwardly from the primary conjugated conductor segment 221, a tertiary conductor segment 221a bonded on the bottom side 10a of the printed circuit board 1 and connected between the further two plated through holes 20 in the board 1 as continuously inflected downwardly from the secondary conjugated conductor segment 222, and a quaternary conjugated conductor segment 222a and so on, to thereby form the second conductive strip 22 sinuously inflected on and in the printed circuit board 1 to alternatively form a lower conductor segment and an upper conductor segment subsequently and continuously bonded on the bottom and the upper sides 10a, 10 of the board 1, with each conductor segment of the second conductive strip 22 conjugatively twisting each conductor segment of the first conductive strip 21 to form a conjugated pair of two conductor segments of the first and the second conductive strips 21, 22 generally X-shaped from a projective top view thereof. Each conductor segment may be formed with a copper strip or other electrically conductive strips.

Figure 4:
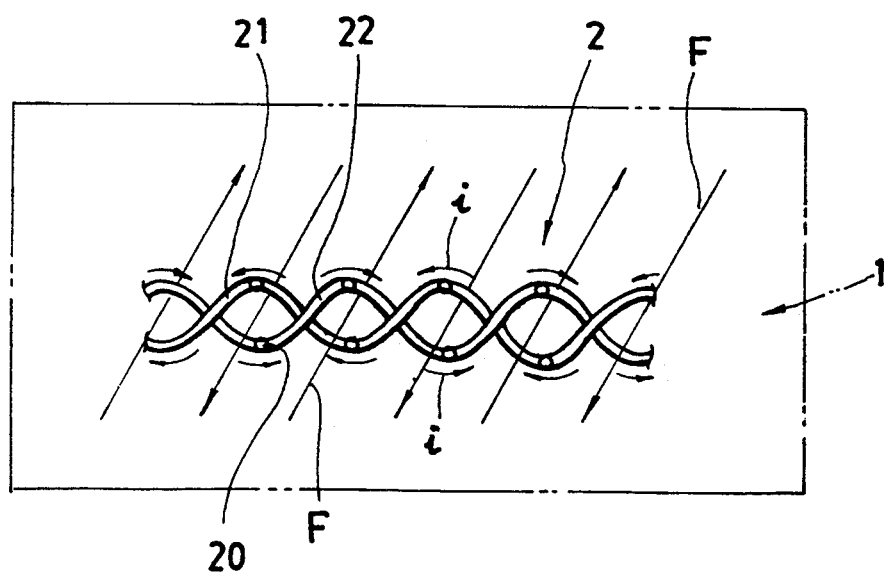
FIG. 4 shows the operating principle of the PCB of FIGS. 1 for counteracting the magnetic flux of the twisted pair.

By the way the twisted pair 2 can be used for reducing radio frequency interferences such as caused by induced voltage or magnetic flux as illustrated in FIGS. 3, 4 respectively. In FIG. 3, the induced voltages V as induced by a magnetic field F will be counteracted in each contiguous or crossing junction area between the two conductive strips 21, 22 of the twisted pair 2, thereby reducing the interferences Caused by the induced voltage. As shown in FIG. 4, when a current i is passing through the two strips 21, 22, the flux F incurred by the current i from the two strips 21, 22 will be counteracted at each crossing junction area of the two strips 21, 22, thereby reducing the interferences caused by the flux.

Figure 5:
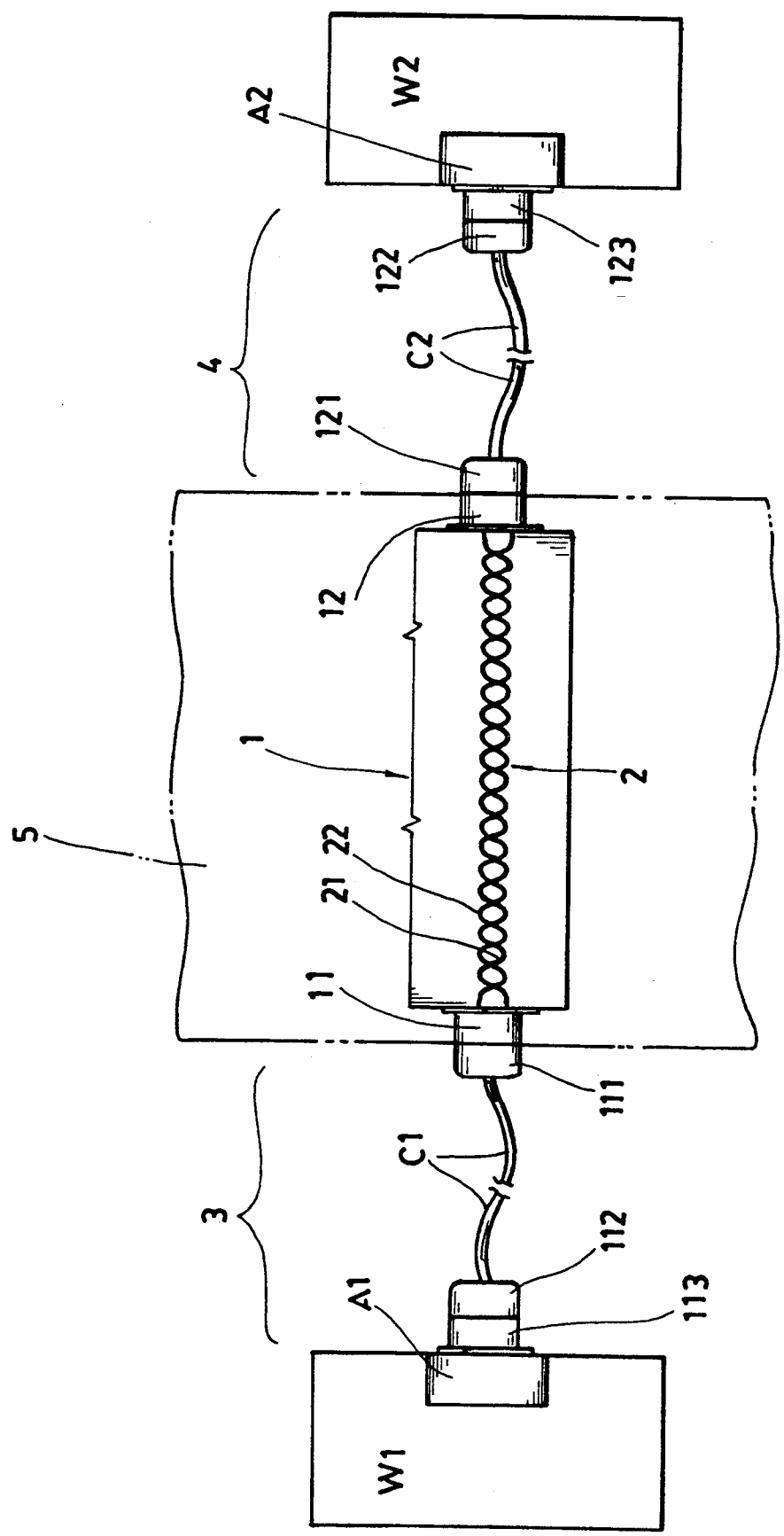
FIG. 5 is an illustration showing an application of the PCB of FIGS. 1 and 2 in a computer communication network.

When used in a computer communication network as shown in FIG. 5, the printed circuit board (PCB) 1 having the twisted pairs 2 formed thereon may be mounted in a transmission medium 5, having a transmitter-end connector 1! connected to a transmitter 3 including a first workstation W1 having a first adapter (or adapter card) A1 and a station connector 113, by two connectors 111, 112 of a first transmission cable C1, and having a receiver-end connector 12 connected to a receiver 4 including a second workstation W2 having a second adapter A2 and another station connector 123, by the other two cable connectors 121, 122 of a second transmission cable C2. Other transmission systems or media, such as a wall jack, a patch panel or a Keystone jack may also be utilized by incorporating the PCB, therein.

Figure 7:
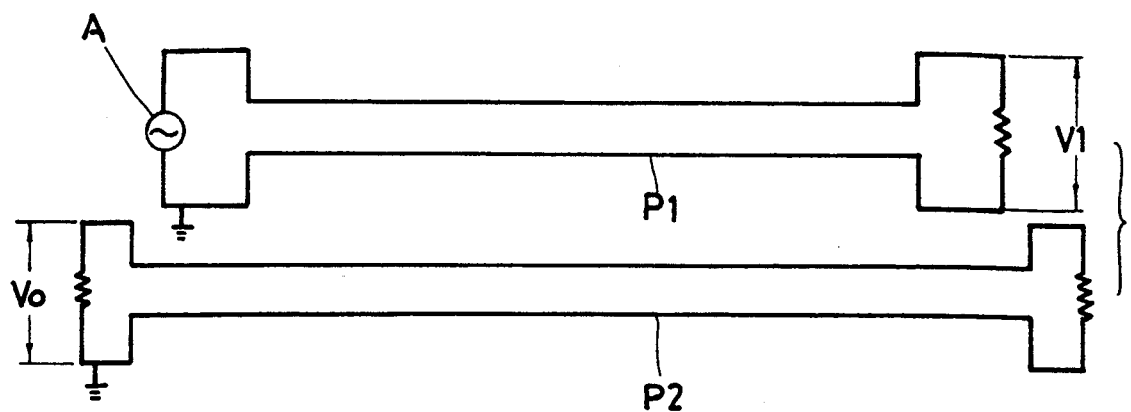
FIG. 7 shows a testing system for obtaining a near end crosstalk (NEXT) loss as effected by a conventional parallel pair of communication loop.

The PCB 1 as shown in FIG. 1 may be tested for obtaining its near end crosstalk (NEXT) loss in dB units by using a testing equipment as shown in FIG. 6, in comparison with the dB loss as obtained in a control test performed by a conventional system as shown in FIG. 7.

In FIG. 7, a voltage V1 is produced in a first pair P1 of two parallel cables by a signal generator A, while an induced voltage $V_o$ is obtained in a second pair P2 of the other two cables. Then a near end crosstalk ( NEXT ) dB loss will be obtained by:

NEXT $(F) = 20 \text{ Log } V_o/V1$

The testing data is calculated and listed in Table 1.

As shown in FIG. 6, a voltage V1 is obtained in the first twisted pair 2 by a signal generator A, while an induced voltage $V_o$ is obtained in a second twisted pair 2A. Therefore the NEXT loss will be calculated to be listed in Table 1, from which, the dB loss can be remarkably increased by the PCB 1 having a twisted pair 2, proving a great reduction of radio frequency interferences as effected by PCB1.

TABLE 1

| Frequency (MHz) | NEXT dB loss | |
|---|---|---|
| | dB loss of the Prior Art | dB loss of the present invention |
| 0.772 | 43 | 72 |
| 1.0 | 41 | 68 |
| 4.0 | 32 | 64 |
| 10.0 | 26 | 60 |
| 16.0 | 23 | 56 |
| 20.0 | 22 | 53 |
| 31.0 | 20 | 47 |
| 62.0 | 17 | 43 |
| 100.0 | 13 | 40 |

Figure 8:
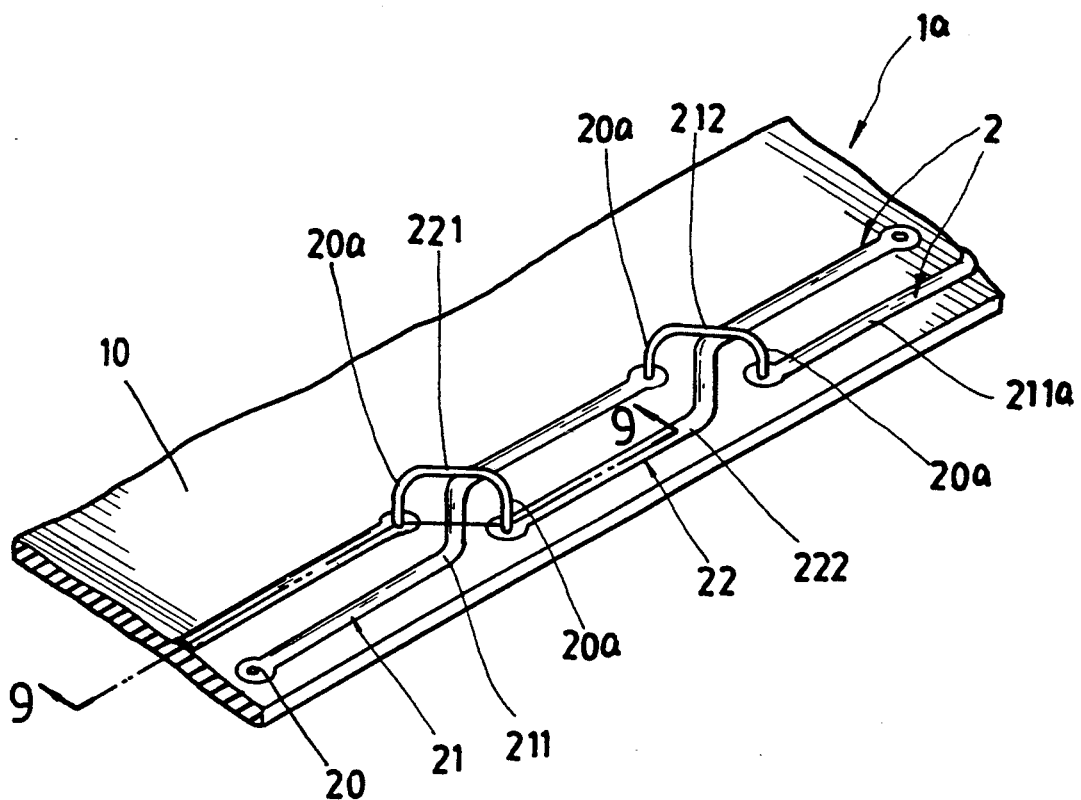
FIG. 8 is a perspective view of the present invention.
Figure 9:
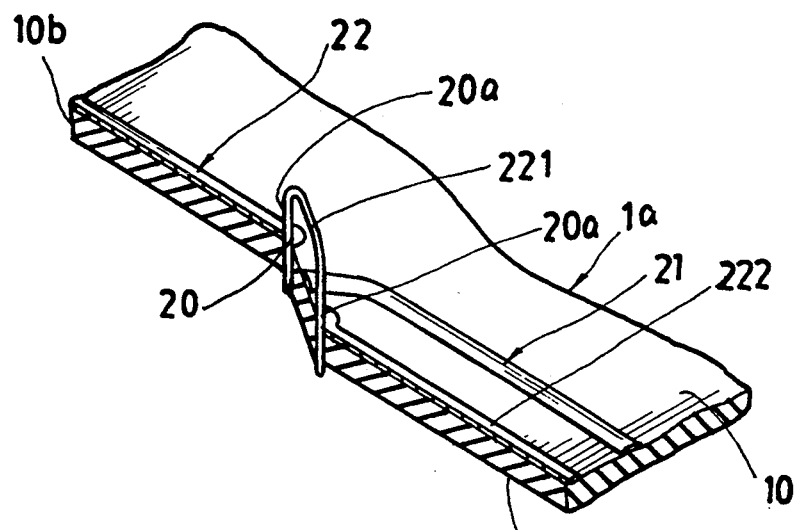
FIG. 9 is a partial sectional drawing as cut away from direction 9—9 of FIG. 8.

The present invention is shown in FIGS. 8 and 9, which is derived from PCB 1 as shown in FIGS. 1 and 2, and includes a single-side printed circuit board (PCB) 1a having the two conductive strips 21, 22 of the twisted pair 2 bonded on the upper side 10 of the PCB 1a, having a jumper 221 or 212 bridged between two contiguous conductor segments of a conductive strip to cross over another conductor segment of the other conductive strip, thereby twisting the two conductive strips 21, 22 on the same side of the PCB 1a. Each jumper has two bare wires 20a inserted into the PCB 1a as shown in FIG. 9.

The present invention may be modified without departing from the spirit and scope as claimed in this invention. Each conductor segment may be suitably arcuated or bent for any desired pattern design.

I claim:

1. A printed circuit board comprising: at least a twisted pair consisting of a first and a second conductive strip bonded of a same side of a single-sided printed circuit board, the first and the second conductive strips continuously twisting with each other to form a signal communication loop between a transmitter and a receiver, each said conductive strip including a plurality of conductor segments each conductor segment sinuously bonded on a side of said single-side printed circuit board, and a plurality of jumpers each said jumper having two bare wires inserted into said printed circuit board to be bridged between two contiguous conductor segments of each said conductive strip to cross over the other conductor segment of the other conductive strip, thereby continuously twisting said first conductive strip with said second conductive strip by forming a plurality of conjugated pairs each conjugated pair formed by an upper jumper of one conductive strip between two conductor segments of one conductive strip, and a lower conductor segment of the other conductive strip traversing under said jumper to form a generally X-shaped configuration from a projective top view of each said conjugated pair of said two conductive strips.

* * * * *